United States Patent
Al-Hokayem (10) Patent No.: US 10,466,281 B2
(45) Date of Patent: Nov. 5, 2019

(54) DETERMINING A FUNDAMENTAL COMPONENT OF AN AC VOLTAGE

(71) Applicant: ABB Schweiz AG, Baden (CH)

(72) Inventor: Peter Al-Hokayem, Baden (CH)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 15/982,469

(22) Filed: May 17, 2018

(65) Prior Publication Data

US 2018/0267085 A1    Sep. 20, 2018

Related U.S. Application Data (63) Continuation of application No. PCT/EP2016/076859, filed on Nov. 7, 2016.

(30) Foreign Application Priority Data

Nov. 17, 2015   (EP) ..................... 15194966

(51) Int. Cl.
*G01R 19/25* (2006.01)
*H02M 1/08* (2006.01)
(Continued)

(52) U.S. Cl.
CPC ..... *G01R 19/2503* (2013.01); *G01R 19/2509* (2013.01); *H02J 3/40* (2013.01);
(Continued)

(58) Field of Classification Search
CPC ... G01R 19/2503; G01R 19/2509; H02J 3/40; H02M 1/00; H02M 1/082; H02M 7/066;
(Continued)

(56) References Cited

U.S. PATENT DOCUMENTS 8,084,874 B2 * 12/2011 Llorente Gonzalez ..................... F03D 7/0224
290/44
9,753,067 B2 * 9/2017 Deng ..................... G01R 25/00
(Continued)

FOREIGN PATENT DOCUMENTS

EP    2623997 A1    8/2013

OTHER PUBLICATIONS

European Patent Office, International Search Report & Written Opinion issued in corresponding Application No. PCT/EP2016/076859, dated Jan. 17, 2017, 12 pp.
(Continued)

*Primary Examiner* — Yemane Mehari
(74) *Attorney, Agent, or Firm* — Taft Stettinius & Hollister LLP; J. Bruce Schelkopf (57) ABSTRACT

A method for estimating a fundamental component of an AC voltage includes receiving a timely varying measurement signal of the AC voltage; parametrizing a fundamental component of the AC voltage; and determining parameters of the fundamental component based on minimizing a cost function. The fundamental component has a rated frequency, a variable amplitude and a variable phase shift. The cost function is based on an integral of a norm of a difference between the measurement signal and the parametrized fundamental component via a time horizon. The time horizon starts at an actual time point and goes back via a predefined length. The cost function includes a term based on a norm of the difference between a value of the fundamental component at the actual time point and a value of a previously estimated fundamental component at the actual time point, where the previously estimated fundamental component has been determined for a previous time point.

20 Claims, 2 Drawing Sheets

(51) Int. Cl.
  *H02J 3/40*    (2006.01)
  *H02M 1/00*    (2006.01)
  *G01R 25/00*   (2006.01)
  *H02M 5/458*   (2006.01)

(52) U.S. Cl.
  CPC ............. *H02M 1/00* (2013.01); *H02M 1/082* (2013.01); *G01R 19/2513* (2013.01); *G01R 25/00* (2013.01); *H02M 5/4585* (2013.01); *H02M 2001/0025* (2013.01)

(58) Field of Classification Search
  CPC ... G05F 1/33; G05F 3/06; H01F 29/14; H01F 2029/143
  USPC ...................................... 363/75–80
  See application file for complete search history.

(56) References Cited

U.S. PATENT DOCUMENTS

| | | | | |
|---|---|---|---|---|
| 2012/0253742 | A1* | 10/2012 | Sahinoglu | G01R 23/15 702/179 |
| 2013/0010505 | A1* | 1/2013 | Bo | H02J 3/386 363/37 |
| 2014/0043014 | A1 | 2/2014 | Ho et al. | |

OTHER PUBLICATIONS

European Patent Office, Extended Search Report issued in corresponding Application No. 15194966.6, dated May 19, 2016, 12 pp.
Mandic, D., "Advanced Signal Processing the Method of Least Squares," May 7, 2015, Retrieved from the Internet: https://web/archive.org/web/20150507145606/http://ww.commsp.ee.ic.ac.uk/mandic/ASP_Slides/ASP_Lecture_6_Least_Squares_2015.pdf.
Sadinezhad et al., "Frequency Adaptive Least-Squares-Kalman Technique for Real-Time Voltage Envelope and Flicker Estimation," IEEE Transactions on Industrial Electronics, vol. 59, No. 8, Aug. 2012, pp. 3330-3341.
Wang et al., "An Overview of Grid Fundamental and Harmonic Components Detection Techniques," Sep. 15, 2013, pp. 5185-5192.
De La O Serna et al, "Dynamic Phasor Estimates for Power System Oscillations," IEE Transactions on Instrumentation and Measurement, vol. 56, No. 5, Oct. 2007, pp. 1648-1657.
Girgis et al., "Optimal Estimation of Voltage Phasors and Frequency Deviation Using Linear and Non-Linear Kalman Filtering: Theory and Limitations," IEEE Transaction on Power Apparatus and Systems, vol. PAS-103, No. 10, Oct. 1984, pp. 2943-2951.
Isaksson et al., "Digital protective relaying through recursive least-squares identification," IEEE Proceedings, Vo. 135, Pt. C, No. 5, Sep. 1988, pp. 441-449.

* cited by examiner

DETERMINING A FUNDAMENTAL COMPONENT OF AN AC VOLTAGE

FIELD OF THE INVENTION

The invention relates to the field of estimation of fundamental components in noisy voltage signals. In particular, the invention relates to a method and a controller for determining a fundamental component of an AC voltage as well as to a method for controlling an electrical converter based on the determined fundamental component.

BACKGROUND OF THE INVENTION

Medium voltage drives comprise power/frequency converters, which are used in various sectors to drive a variety of machines and processes.

Basic features of an electrical converter are power flow and energy storage. For example, the electrical converter may absorb power from a three-phase AC power source (such as an electrical grid), storing this power as energy in DC form using capacitors or inductors, and finally converting this stored energy back to AC form and driving an electric machine, such as an electrical motor. This power flow also may be reversed, for example, when wind energy is harvested, i.e. a wind turbine may convert mechanical power to electric power, which is rectified and stored. Finally, the stored DC energy may be inverted and fed back to the grid in an AC form. Furthermore, alternating the power flow at least at the rectifier side and/or the inverter side is also possible for short periods of time to allow extra controllability of the medium voltage drive.

The control of the power flow may be based on an estimation of a fundamental component of the AC voltages at the connection point of the medium voltage drive to the grid. For example, in US 2014/0043014 A1, measurement signals of AC voltages are filtered in a complex way to estimate fundamental components of the AC voltages.

"Frequency Adaptive Least-Squares Kalman Technique for Real-Time Voltage Envelope and Flicker Estimation", IEEE TRANSACTIONS ON INDUSTRIAL ELECTRONICS, IEEE SERVICE CENTER, PISCATAWAY, N.J., USA, vol. 59, no. 8, 1 Aug. 2012 provides a method for estimating a fundamental component of an AC voltage. Also in US 2012/0253742 A1 a method for estimating a fundamental component of an AC voltage is disclosed.

In EP 2 623 997 A1 a method and an apparatus for determining a phase and a frequency of an electric quantity being associated with an operation of an electrical device are described.

DESCRIPTION OF THE INVENTION

It is an objective of the invention to automatically estimate fundamental components of AC voltage signals in a simple, fast and precise way.

This objective is achieved by the subject-matter of the independent claims. Further exemplary embodiments are evident from the dependent claims and the following description.

An aspect of the invention relates to a method for estimating a fundamental component of an AC voltage. For example, the AC voltage may be measured in a connection point between an electrical converter and an electrical grid. Usually, the electrical converter may be supplied with a three-phase voltage and the method may determine a fundamental component for each phase voltage, or a fundamental component vector in a Clarke transformed coordinate system.

According to an embodiment of the invention, the method comprises: receiving a timely varying measurement signal of the AC voltage; parametrizing a fundamental component of the AC voltage, the fundamental component having a rated frequency, a variable amplitude and a variable phase shift; and determining parameters of the fundamental component based on minimizing a cost function, wherein the cost function is based on an integral of a norm of a difference between the measurement signal and the parametrized fundamental component via a time horizon, the time horizon starting at an actual time point and going back via a predefined length.

The measurement signal may be an analog and/or digital signal encoding the current voltage value of the measured AC voltage. For example, the measurement signal may comprise sampled voltage values, which have been sampled with a predefined sample frequency that may be (much) shorter than a fundamental frequency of the AC voltage. Since the AC voltage varies over time, also the sampled voltage values are varying over time.

The AC voltage may comprise noise and/or ripples, i.e. higher order frequency components, and thus may be deviated from a pure sinusoidal voltage. The method may be used for determining the actual pure sinusoidal voltage, i.e. the fundamental component from the measurement signal.

It has to be noted that the fundamental component may be estimated for every time step of a controller, which is performing the method, i.e. the method may be repeated regularly with a frequency much higher as the frequency of the fundamental component.

The fundamental component may be modeled based on an amplitude, a phase shift and a frequency. For example, the fundamental component may be based on a correspondingly phase-shifted sine function scaled by the amplitude.

In the method it is assumed that the fundamental component has a rated (fixed) frequency but varying amplitude and phase shift. The fundamental component is parametrized with parameters to be determined and these parameters are determined with the aid of a cost function.

The cost function is based on a difference between the parametrized fundamental component and the voltage signal. The norm of the difference is integrated over a specific time horizon, which may start at the actual time point and which may go back over a predefined time interval. For example, the norm is the absolute value of the difference.

When the method is used for estimating at least two fundamental components of at least two AC voltages (such as a multi-phase voltage), the fundamental component and the measurement signal may be vectors at each time point and the norm may relate to the norm of a vector. For example, the norm may be the squared norm of the vector, i.e. the sum of squares of each component of the vector.

In general, the method may use least squares to determine the parameters.

In the end, the parameters of the fundamental components may be determined from equations, which have been calculated offline (before the executing of the method in a controller) by analytically solving the optimization problem posed by the cost function. Alternatively, the parameters may be determined by online solving the optimization problem in the controller, which, for example, may be done, when the optimization problem cannot be solved analytically, which may be the case in the presence of constraints on the input data to the optimization problem.

According to the invention, the cost function comprises a term based on a norm (which may be the square norm) of the difference between a value of the fundamental component at the actual time point and a value of a previous fundamental component at the actual time point, whereby the previous fundamental component has been determined for a previous time point.

This term may be multiplied with a weight and added to the term comprising the integral of the difference between the parametrized fundamental component and the measurement signal. With this term, a better numerical stability of the solution of the optimization problem may be guaranteed.

According to an embodiment of the invention, the parameters are functions of the amplitude and the phase shift of the fundamental component to be determined. For example, the parameters may be combinations of the amplitude and a trigonometric (sine and/or cosine) function of the phase shift. It is not necessary that the amplitude and/or the phase shift are directly determined from the optimization problem. It may be possible that the parameters are non-linear functions of the amplitude and the phase shift, which may facilitate analytically solving the optimization problem.

According to an embodiment of the invention, the parameters are chosen, such that the cost function is a quadratic function of the parameters and the cost function has a term quadratic in the parameters defined by a cost function matrix and a term linear in the parameters defined by a cost function vector.

For example, the parameters may be chosen in such a way that the optimization problem is formulated as a quadratic program. In this case, the cost function may comprise a term quadratic in the parameters (encoded in the cost function matrix) and/or a term linear in the parameters (encoded in the cost function vector).

In such a way, analytical solutions and online solution methods for solving quadratic programs may be used for calculating the parameters.

According to an embodiment of the invention, the cost function matrix is based on an integral of products of trigonometric functions of a rated fundamental frequency. The cost function matrix may only depend on the rated frequency and/or the weight for the second term of the cost function, and need not depend on the measurement signal.

The trigonometric functions (sine and/or cosine) may only depend on the rated frequency and therefore may be provided precalculated. Only the integral over the horizon may have to be evaluated to calculate the cost function matrix.

It has to be noted that the cost function matrix also may comprise a term with the weight for the additional term of the cost function, which term of the cost function is based on a previous fundamental component multiplied by the identity matrix. This term may numerically stabilize the calculations, when the cost function matrix is inverted (see below).

According to an embodiment of the invention, the cost function vector is based on an integral of products of the measurement signal with trigonometric functions of a rated fundamental frequency. Also, the trigonometric functions (sine and/or cosine) may only depend on the rated frequency and therefore may be pre-calculated offline and stored for online usage.

The cost function vector additionally may comprise a term relating to the additional term of the cost function relating to the value of a previous fundamental component at the actual time point.

In the case, when no further constraints are provided in the optimization problem except the cost function, the extremum of the cost function may be determined by differentiating the cost function with respect to the parameters. For a quadratic cost function, the resulting linear equations for the parameters may be solved, by multiplying with the inverted cost function matrix. In particular, the parameters may be calculated by multiplying the inverse of the of the cost function matrix with the cost function vector.

According to an embodiment of the invention, equations for the cost function matrix and the cost function vector have been determined offline by minimizing the cost function analytically, wherein the parameters are calculated from the equations by determining the cost function matrix and the cost function vector from the measurement signal.

In this case, the entries of the cost function matrix and the cost function vector have to be determined based on the actual time step, the horizon and the values of the measurement signal falling into the horizon. After that, the cost function matrix has to be inverted and multiplied with the cost function vector to calculate the parameters of the fundamental component.

According to an embodiment of the invention, the cost function is minimized online. For example, in the presence of further constraints, the optimization problem may be solved online.

According to an embodiment of the invention, at least two measurement signals for AC voltage components of a multi-phase voltage are received, wherein at least two fundamental components for the at least two measurement signals are parametrized and their parameters are determined based on minimizing one cost function for the at least two fundamental components.

In the case of a multi-phase AC voltage, which may result in a measurement signal for every phase, an actual component for every phase may be estimated. This estimation may be based on a single cost function, in which the parameters for the fundamental components of all phases and the measurement signals of all phases are included. In particular, the values of the measurement signals and/or fundamental components at a specific time point may be treated as vectors and the norm(s) in the cost function may be vector norms.

According to an embodiment of the invention, the at least two measurement signals are Clarke-transformed and the parameters are determined in a Clarke transformed reference frame. In this case, the three-component vectors of the original measurement signal and the corresponding fundamental components may be transformed into two-component vectors, which may simplify calculations and/or which may accelerate online calculations.

According to an embodiment of the invention, the horizon has a length of more than 0.01 the period of the rated frequency of the fundamental component. Such length may guarantee an accurate and fast to calculate estimate for the fundamental component, even in the case of a very noisy signal.

In the end, the resulting estimate of the fundamental component encoded in the parameters may be used to compute an estimated amplitude, an estimated phase angle, estimated magnitude and/or an estimated fundamental frequency of the fundamental component. For a three-phase AC voltage, these values may be calculated in the Clarke transformed coordinate system.

According to an embodiment of the invention, the method further comprises: calculating an actual amplitude and/or an actual phase shift of the fundamental component from the parameters. The amplitude and/or actual phase shift may be calculated from the parameters by inverting the defining functions of the parameters, which depend in the actual amplitude and the actual phase shift.

According to an embodiment of the invention, the method further comprises: calculating an actual phase angle of the fundamental components of a multi-phase AC voltage from the parameters. For a three-phase AC voltage, this phase angle may be the angle of the 2D voltage vector in the Clarke transformed coordinate system, which angle may be calculated from the amplitudes and phase shifts of the fundamental components.

According to an embodiment of the invention, the method further comprises: calculating an actual frequency of the fundamental components of a multi-phase AC voltage based on a difference between the actual phase angle and a previous phase angle calculated from a previous fundamental component. Also, it has been assumed during solving the optimization problem that the fundamental frequency is always equal to a rated frequency, it is possible to determine the actual frequency in this way.

A further aspect of the invention relates to a method for controlling an electrical converter, in which a fundamental component of an AC voltage supplied to the converter is determined as described above and below and a reference voltage for the converter is controlled based on the fundamental component. For example, an active rectifier may be controlled based on the method.

In particular, with the estimation method, an accurate estimate of the fundamental components of individual phases and/or axes of a single or three-phase electric system may be provided to a controller of an electrical converter. This estimate of the fundamental component may be used in closed-loop with any control method as it is independent of the underlying method.

A further aspect of the invention relates to a controller for a converter, which is adapted for performing the method of one of the previous claims. It has to be understood that features of the methods as described in the above and in the following may be features of the controller as described in the above and in the following.

It has further to be understood that the method may be implemented at least partially in software. For example, the controller may comprise a processor and a computer program, which, when being executed on the processor, is adapted for performing the method as described above and below.

The method also may be implemented at least partially in hardware. For example, the controller may comprise a DSP and/or FPGA implementing parts or all of the method as described above and below.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
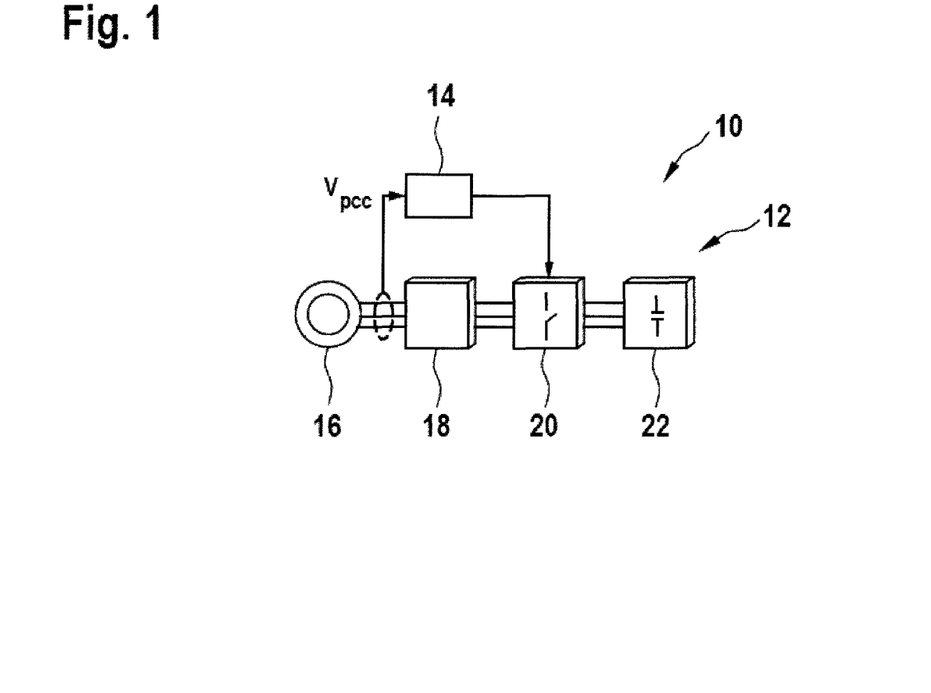
FIG. 1 schematically shows a converter system according to an embodiment of the invention.

FIG. 1 shows a converter system 10, which comprises an electrical converter 12 controlled by a controller 14. The electrical converter 12 is connected to an electrical grid 16 or equivalent power source and comprises a transformer 18, a rectifier 20 and a DC link 22, which may comprise a bank of capacitors. The DC link 22 may be connected to a load, like a combination of an inverter with an electrical motor. It also may be possible that the DC link is connected via an inverter to an electrical generator, i.e. it is possible that there is a power flow in the converter system 10 from the grid 16 to the DC link 22 or vice versa from the DC link 22 to the grid 16.

The electrical grid 16 may supply the electrical converter 12 and in particular the transformer 18 with a three-phase AC voltage $V_{pcc}$, which (after transformation) is supplied to the rectifier 20, which produces a DC voltage supplied to the DC link 22.

The controller 14 may be adapted for controlling the electrical converter 14 and in particular the rectifier 20, which may be an active rectifier. Furthermore, the controller 14 may be adapted for controlling an inverter connected to the DC link 22.

In particular, the controller 14 may be adapted for stabilizing the stored energy in the DC link 22 at a prespecified level. The controller 14 may consider to draw limited power from the DC link 22 in the presence of various requests for power withdrawal from the DC link 22. This is, for example, the case of a full power converter in which the DC link 22 is connected to an inverter that converts the DC voltage to an AC voltage in order to drive an electric machine.

In order to be able to maintain the energy storage at some prespecified level, the controller 14 may control the active power drawn from the grid/source 16. This latter functionality of the controller 14 may rely on the knowledge of the fundamental components $V_{pcc}^1$ of the voltage $V_{pcc}$ at the point of common coupling. The fundamental component is not measurable but must be estimated from the measured AC voltage $V_{pcc}$, which is given by $$V_{pcc} = V_{pcc}^1 + V_{pcc}^H$$

where $V_{pcc}^1$ is the fundamental component of the measurement signal and $V_{pcc}^H$ comprises all the harmonics that are present in the signal. Typically.

$$V_{pcc}^H = \sum_{k \neq 1} V_{pcc}^k$$

where is $V_{pcc}^k$ the k-th harmonic component. The signal to noise ratio $$SNR = \frac{\|V_{pcc}^1\|}{\|V_{pcc}^H\|}$$

is usually quite high in a medium voltage converter 12 due to the limited value of the switching frequency.

The controller 14 is adapted for determining an estimate $\hat{V}_{pcc}^1$ of the fundamental component $V_{pcc}^1$, which will be described with respect to FIG. 2.

Figure 2:
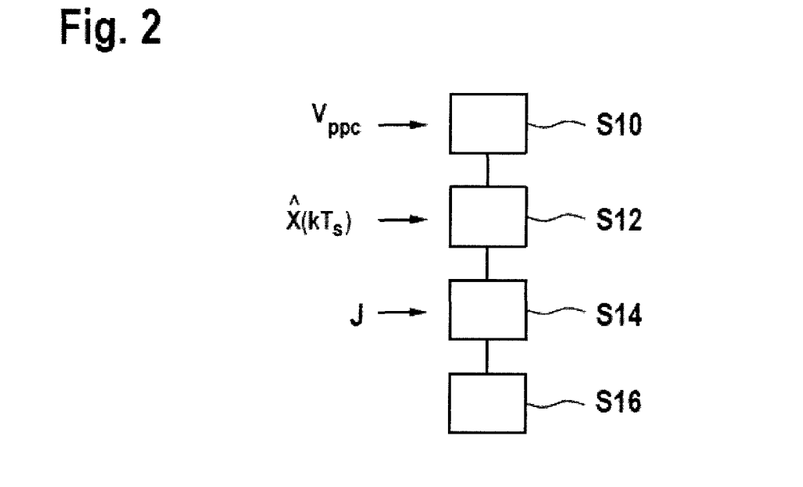
FIG. 2 shows a flow diagram for a method for determining a fundamental component of an AC voltage according to an embodiment of the invention.

FIG. 2 shows a flow diagram for a method for determining an estimated fundamental component $\hat{V}_{pcc}^1$ based on the measurement signal $V_{pcc}$.

It has to be noted that the AC voltage $V_{pcc}$ and the estimated fundamental component $\hat{V}_{pcc}^1$ may be vectors, for example three component vectors in the case of a three-phase voltage. The vectors $V_{pcc}$ and $\hat{V}_{pcc}^1$ may be seen as multiple single AC voltages and multiple single estimated fundamental components.

In step S10, a timely varying measurement signal of the AC voltage $V_{pcc}$ is received. For example, the AC voltage $V_{pcc}$ may be measured at the point of common coupling of the converter 12 to the electrical grid/source 16.

For example, at the Point of Common Coupling (PCC), a three-phase AC voltage $V_{pcc}$ may be measured, which may be then Clarke transformed into the xy or αβ fixed frame through the Clarke transformation $$T_{abc}^{xy} = \frac{2}{3}\begin{bmatrix} 1 & -\frac{1}{2} & -\frac{1}{2} \\ 0 & \frac{\sqrt{3}}{2} & -\frac{\sqrt{3}}{2} \end{bmatrix}$$

As such, and without any loss of generality, we shall pursue the derivations in the xy plane but the same holds for the abc components.

The method for extracting/estimating the fundamental component $\hat{V}_{pcc}^1$ from the measured signal of the AC voltage $V_{pcc}$ is based on a cost function J.

In particular, the optimization problem, on which the method is based is $$\min_{\hat{m}_x,\hat{m}_y,\hat{\varphi}_x,\hat{\varphi}_y} J = \int_{kT_s-h}^{kT_s} \left\|V_{pcc}(\tau) - \hat{V}_{pcc}^1(\tau, kT_s)\right\|^2 d\tau + \quad (1)$$

$$\lambda \left\|\hat{V}_{pcc}^1(kT_s, kT_s) - \hat{V}_{pcc}^{1*}(kT_s, (k-1)T_s)\right\|^2$$

subject to $$\hat{V}_{pcc}^1(\tau, kT_s) = \begin{bmatrix} \hat{m}_x(kT_s)\sin(\omega\tau + \varphi_x(kT_s)) \\ \hat{m}_y(kT_s)\sin(\omega\tau + \varphi_y(kT_s)) \end{bmatrix}$$

where J is a quadratic cost function to be minimized, h is a horizon or window of time (in the range of few millisecond) over which we posit the cost function, $\lambda \geq 0$ is a continuity/convexification weight factor, $\hat{m}_x$, $\hat{m}_y$, $\hat{\varphi}_x$, and $\hat{\varphi}_y$ are the modulation indices and phase shifts in the x and y components of the estimated vector $\hat{V}_{pcc}$, $T_s$ is the sampling time (usually few tens of millisecond), and $\hat{V}_{pcc}^{1*}$ is the previously estimated fundamental component that was computed at the previous time step $(k-1)T_s$.

The cost function J is based on an integral of a norm of a difference between the measurement signal $V_{pcc}$ and the fundamental component $\hat{V}_{pcc}^1$ via a time horizon h, the time horizon starting at an actual time point $kT_s$ and going back via a predefined length.

It has to be noted that in the optimization problem (1), the fundamental component $\hat{V}_{pcc}^1$ has a rated frequency ω, variable amplitudes $\hat{m}_x$, $\hat{m}_y$ and variable phase shifts $\hat{\varphi}_x$, $\hat{\varphi}_y$.

However, for solving the optimization problem (1), not the variables $\hat{m}_x$, $\hat{m}_y$, $\hat{\varphi}_x$, and $\hat{\varphi}_y$ but other parameters are used.

In particular, the optimization problem (1) may be simplified by rewriting the fundamental component $\hat{V}_{pcc}^1$ using trigonometric identities as $$\hat{V}_{pcc}^1(\tau, kT_s) = I_{2\times 2} \otimes [\sin(\omega\tau) \quad \cos(\omega\tau)]\begin{bmatrix} \hat{m}_x(kT_s)\cos(\hat{\varphi}_x(kT_s)) \\ \hat{m}_x(kT_s)\sin(\hat{\varphi}_x(kT_s)) \\ \hat{m}_y(kT_s)\cos(\hat{\varphi}_y(kT_s)) \\ \hat{m}_y(kT_s)\sin(\hat{\varphi}_y(kT_s)) \end{bmatrix} \quad (2)$$

$$\triangleq I_{2\times 2} \otimes [\sin(\omega\tau) \quad \cos(\omega\tau)]\hat{x}(kT_s)$$

where $\hat{x}(kT_s)$ are another set of parameters of the fundamental component $\hat{V}_{pcc}^1$ non-linear related to the variables $\hat{m}_x$, $\hat{m}_y$, $\hat{\varphi}_x$, and $\hat{\varphi}_y$. In (2), for any two matrices A and B the Kronecker product is defined as $$A \otimes B = \begin{bmatrix} A_{1,1}B & A_{1,2}B & \cdots & A_{1,m}B \\ A_{2,1}B & A_{2,2}B & \cdots & A_{2,m}B \\ \vdots & \vdots & \ddots & \vdots \\ A_{n,1}B & A_{n,2}B & \cdots & A_{n,m}B \end{bmatrix}.$$

With this parameterization, the optimization problem (1) may be transformed to the following (almost) equivalent problem (where the weight λ also has been redefined)

$$\text{minimize } J = \int_{kT_s-h}^{kT_s} \|V_{pcc}(\tau) - I_{2\times 2} \otimes [\sin(\omega\tau) \quad \cos(\omega\tau)]\hat{x}(kT_s)\|^2 d\tau + \quad (3)$$

$$\lambda\|\hat{x}(kT_s) - \hat{x}^*((k-1)T_s)\|^2$$

Therefore, in step S12, the fundamental component $\hat{V}_{pcc}^1$ of the AC voltage $V_{pcc}$ is parametrized with the parameters $\hat{x}(kT_s)$.

When one defines a cost function matrix by $$H(kT_s) = \int_{kT_s-h}^{kT_s} I_{2\times 2} \otimes [\sin(\omega\tau) \quad \cos(\omega\tau)]^T[\sin(\omega\tau) \quad \cos(\omega\tau)]d\tau + \lambda I_{4\times 4}$$

and a cost function vector by $$f(kT_s)^T = \int_{kT_s-h}^{kT_s} V_{pcc}(\tau)^T I_{2\times 2} \otimes [\sin(\omega\tau) \quad \cos(\omega\tau)]d\tau + \hat{x}^*((k-1)T_s)^T$$

the cost function J can be rewritten as $$J = \hat{x}(kT_s)^T H(kT_s)\hat{x}(kT_s) - 2f(kT_s)^T \hat{x}(kT_s) + c(kT_s)$$

where c is a term not depending on the parameters $\hat{x}(kT_s)$.

In such a way, the optimization problem has been cast in a standard quadratic form or quadratic program (here with trivial constraints).

In the presence of further constraints, this quadratic program may be solved online by the controller 14.

Alternatively, the optimal (unconstrained) solution of the quadratic program is computed by setting $$\frac{\partial J}{\partial \hat{x}(kT_s)} = 0,$$

and is given by $$\hat{x}^*(kT_s) = \begin{bmatrix} \hat{x}_1^*(kT_s) \\ \hat{x}_2^*(kT_s) \\ \hat{x}_3^*(kT_s) \\ \hat{x}_4^*(kT_s) \end{bmatrix} = H(kT_s)^{-1} f(kT_s) \quad (4)$$

It is important to note that the inverse cost function matrix $H(kT_s)^{-1}$ exists and becomes numerically more stable as we increase the values of h and λ.

In step S14 of the method, the optimal values $\hat{x}^*(kT_s)$ of the parameters $\hat{x}(kT_s)$ of the fundamental component are determined based on minimizing the cost function J, either by solving the quadratic program online or by using the equations (4), which have been determined analytically.

In step S18, after the estimation of the optimal values the fundamental component $\hat{V}_{pcc}^1$ and/or at least some specific quantities based on the fundamental component may be calculated from the optimal estimated values $\hat{x}^*$. The definition of the estimated optimal values $\hat{x}^*$ in (2) of the parameters $\hat{x}(kT_s)$ may be used to obtain the amplitudes and/or phase shifts at time step $kT_s$ as $$\hat{m}_x^*(kT_s) = \sqrt{(\hat{x}_1^*(kT_s))^2 + (\hat{x}_2^*(kT_s))^2}, \hat{\phi}_x^*(kT_s) = \tan^{-1}\left(\frac{\hat{x}_2^*(kT_s)}{\hat{x}_1^*(kT_s)}\right)$$

$$\hat{m}_y^*(kT_s) = \sqrt{(\hat{x}_3^*(kT_s))^2 + (\hat{x}_4^*(kT_s))^2}, \hat{\phi}_y^*(kT_s) = \tan^{-1}\left(\frac{\hat{x}_4^*(kT_s)}{\hat{x}_3^*(kT_s)}\right)$$

Furthermore, the estimated magnitude of the estimated vector $\hat{V}_{xy}^*$ may be calculated by $$\|\hat{V}_{pcc}^{1*}\| = \sqrt{(\hat{m}_x^*(kT_s))^2 \sin^2(\omega(kT_s) + \hat{\phi}_x^*(kT_s)) + (\hat{m}_y^*(kT_s))^2 \sin^2(\omega(kT_s) + \hat{\phi}_y^*(kT_s))}$$

Moreover, the corresponding estimated angle may be calculated by $$\theta_{PLL}^*(kT_s) \triangleq \angle \hat{V}_{pcc}^{1*} = \arctan\left(\frac{(\hat{m}_y(kT_s))\sin(\omega(kT_s) + \hat{\phi}_y(kT_s))}{(\hat{m}_x(kT_s))\sin(\omega(kT_s) + \hat{\phi}_x(kT_s))}\right)$$

In order to obtain the estimated speed of the rotation $\hat{\omega}$ or estimated frequency, i.e., the estimated fundamental rotational frequency, a discrete derivative of the angle may be taken, i.e., $$\hat{\omega} = \frac{\theta_{PLL}^*(kT_s) - \theta_{PLL}^*((k-1)T_s)}{T_s}$$

It is important to note that there are methods that rely on the so-called virtual flux as a quantity for control, for such methods, one can easily create a flux estimate by the following operation $$\hat{\Psi}^1(t) = \begin{bmatrix} 0 & -1 \\ 1 & 0 \end{bmatrix} \hat{V}^1(t)$$

Furthermore, it has to be noted that the x and y components as well as the abc components of the fundamental component $\hat{V}_{pcc}^1$ may be treated as separate estimation problems, i.e. they may be optimized independently from each other. In this way, the multidimensional optimization problem is split into two or more identical lower dimensional optimization problems.

Figure 3:
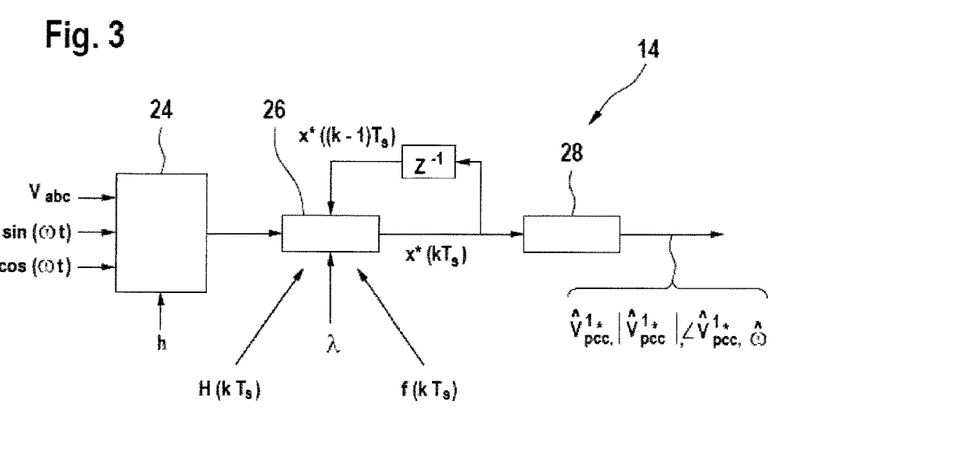
FIG. 3 schematically shows a controller for determining a fundamental component of an AC voltage according to an embodiment of the invention.

FIG. 3 shows a control scheme that may be implemented by the controller 14 for determining an optimal estimate $\hat{V}_{pcc}^{1*}$ of the fundamental component $\hat{V}_{pcc}^1$.

The integrator block 24 may receive the measurement signals of the AC voltage $V_{abc}$ and may transform it as described with respect to step S10 above.

Furthermore, the integrator block 24 may receive the values of the sine and cosine functions as used in the parametrized cost function matrix $H(kT_s)$ and cost function vector $f(kT_s)$ defined above with respect to step S12 and may calculate the integral parts of the cost function matrix $H(kT_s)$ and the cost function vector $f(kT_s)$ by performing a discrete integration on the received values.

In the optimizer block 26, which receives the weight factor λ and the optimal estimated parameters $x^*((k-1)T_s)$ of the previous time step, the final results of the cost function matrix $H(kT_s)$ and the cost function vector $f(kT_s)$ are calculated, the cost function matrix $H(kT_s)$ is inverted and multiplied by the cost function vector $f(kT_s)$ to calculate the optimal estimated parameters $x^*(kT_s)$ of the actual time step.

The optimal estimated parameters $x^*(kT_s)$ are received in the post-processing block 28, which determines further quantities such as the estimated magnitude $\|\hat{V}_{pcc}^{1*}\|$ and/or the estimated angle $\angle \hat{V}_{pcc}^{1*}$ of the optimal estimated fundamental component $\hat{V}_{pcc}^{1*}$.

Figure 4:
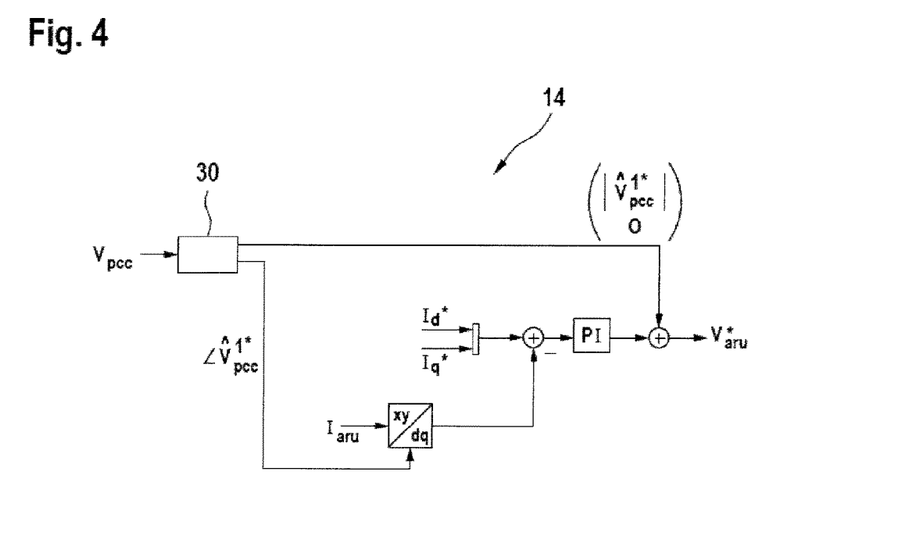
FIG. 4 schematically shows a controller for controlling an electrical converter according to an embodiment of the invention.

FIG. 4 shows a control scheme that may be implemented by the controller 14 for controlling the active rectifier 18 based on the optimal estimate $\hat{V}_{pcc}^{1*}$ of the fundamental component $\hat{V}_{pcc}^1$.

Estimation block 30 may perform the steps of the method of FIG. 2 and/or may implement the control scheme of FIG. 3.

The estimated magnitude $\|\hat{V}_{pcc}^{1*}\|$ of the optimal estimated fundamental component $\hat{V}_{pcc}^{1*}$ is used for modifying a reference voltage $V_{aru}^*$ for the rectifier 20.

The reference voltage $V_{aru}^*$ is based on a difference between a DC link current, which is determined from an active current and $I_d^*$ a reactive current $I_q^*$, and a shifted converter current, which is determined based on a converter current and the estimated angle $\angle \hat{V}_{pcc}^{1*}$ of the optimal estimated fundamental component.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 converter system
12 electrical converter
14 controller
16 electrical grid/source
18 transformer
20 rectifier
22 DC link
$V_{pcc}$ AC voltage
$V_{pcc}^1$ fundamental component
$\hat{V}_{pcc}^1$ fundamental component to be optimized
J cost function
h horizon
$\hat{x}(kT_s)$ parameters of the fundamental component
$H(kT_s)$ cost function matrix
$f(kT_s)$ cost function vector
$\hat{V}_{pcc}^{1*}$ estimated fundamental component
ω estimated speed of the rotation
24 integrator block
26 optimizer block
28 post-processing block
30 estimation block

The invention claimed is:

1. A method for estimating a fundamental component ($\hat{V}_{pcc}^1$) of an AC voltage ($V_{pcc}$), the method comprising:
receiving a timely varying measurement signal of the AC voltage ($V_{pcc}$);
parametrizing a fundamental component ($\hat{V}_{pcc}^1$) of the AC voltage ($V_{pcc}$), the fundamental component ($\hat{V}_{pcc}^1$) having a rated frequency, a variable amplitude and a variable phase shift;
determining parameters ($\hat{x}(kT_s)$) of the fundamental component ($\hat{V}_{pcc}^1$) based on minimizing a cost function (J), wherein the cost function (J) is based on an integral of a norm of a difference between the measurement signal and the parametrized fundamental component via a time horizon (h), the time horizon (h) starting at an actual time point and going back via a predefined length,
wherein
the cost function (J) comprises a term based on a norm of the difference between a value of the fundamental component($\hat{V}_{pcc}^1$) at the actual time point and a value of a previously estimated fundamental component ($\hat{V}_{pcc}^{1*}$) at the actual time point, wherein the previously estimated fundamental component has been determined for a previous time point.

2. The method of claim 1,
wherein the parameters ($\hat{x}(kT_s)$) are functions of the amplitude and the phase shift.

3. The method of claim 1,
wherein the parameters ($\hat{x}(kT_s)$) are chosen, such that the cost function (J) is a quadratic function of the parameters and the cost function (J) has a term quadratic in the parameters defined by a cost function matrix ($H(kT_s)$) and a term linear in the parameters defined by a cost function vector ($f(kT_s)$).

4. The method of claim 3,
wherein the cost function matrix ($H(kT_s)$) is based on an integral of products of trigonometric functions of a rated fundamental frequency; and/or
wherein the cost function vector ($f(kT_s)$) is based on an integral of products of the measurement signal with trigonometric functions of a rated fundamental frequency.

5. The method of claim 3,
wherein equations for the cost function matrix ($H(kT_s)$) and the cost function vector ($f(kT_s)$) have been determined offline by minimizing the cost function (J) analytically; and/or
wherein the parameters ($\hat{x}(kT_s)$) are calculated from the equations by determining the cost function matrix ($H(kT_s)$) and the cost function vector ($f(kT_s)$) from the measurement signal; and/or
wherein the parameters ($\hat{x}(kT_s)$) are calculated based on the inverse of the cost function matrix ($H(kT_s)$).

6. The method of claim 1,
wherein the cost function (J) is minimized online.

7. The method of claim 1,
wherein at least two measurement signals for AC voltage components of a multi-phase voltage are received;
wherein at least two fundamental components for the at least two measurement signals are parametrized and their parameters are determined based on minimizing one cost function for the at least two fundamental components.

8. The method of claim 1,
wherein the at least two measurement signals are Clarke transformed and the parameters are determined in a Clarke transformed reference frame.

9. The method of claim 1,
wherein the horizon (h) has a length of more than 0.01 the period of the rated frequency of the fundamental component.

10. The method of claim 1, further comprising:
calculating an actual amplitude and/or an actual phase shift of the fundamental component ($\hat{V}_{pcc}^1$) from the parameters.

11. The method of claim 1, further comprising:
calculating an actual phase angle of fundamental components ($\hat{V}_{pcc}^1$) of a multi-phase AC voltage from the parameters.

12. The method of claim 11, further comprising:
calculating an actual frequency of fundamental components ($\hat{V}_{pcc}^1$) of a multi-phase AC voltage based on a difference between the actual phase angle and a previous phase angle calculated from a previous fundamental component.

13. A method for controlling an electrical converter, the method comprising:
determining a fundamental component ($\hat{V}_{pcc}^1$) of an AC voltage supplied to the converter according to:
receiving a timely varying measurement signal of the AC voltage ($V_{pcc}$);
parametrizing a fundamental component ($\hat{V}_{pcc}^1$) of the AC voltage ($V_{pcc}$), the fundamental component ($\hat{V}_{pcc}^1$) having a rated frequency, a variable amplitude and a variable phase shift;
determining parameters ($\hat{x}(kT_s)$) of the fundamental component ($\hat{V}_{pcc}^1$) based on minimizing a cost function (J), wherein the cost function (J) is based on an integral of a norm of a difference between the measurement signal and the parametrized fundamental component via a time horizon (h), the time horizon (h) starting at an actual time point and going back via a predefined length, wherein the cost function (J) comprises a term based on a norm of the difference between a value of the fundamental component ($\hat{V}_{pcc}^1$) at the actual time point and a value of a previously estimated fundamental component ($\hat{V}_{pcc}^{1*}$) at the actual time point, wherein the previously estimated fundamental component has been determined for a previous time point;

controlling a reference voltage for the converter based on the fundamental component ($\hat{V}_{pcc}^1$).

14. A controller for a converter, wherein the controller is adapted for performing a method of:

receiving a timely varying measurement signal of the AC voltage ($V_{pcc}$);

parametrizing a fundamental component ($\hat{V}_{pcc}^1$) of the AC voltage ($V_{pcc}$), the fundamental component ($\hat{V}_{pcc}^1$) having a rated frequency, a variable amplitude and a variable phase shift;

determining parameters ($\hat{x}(kT_s)$) of the fundamental component ($\hat{V}_{pcc}^1$) based on minimizing a cost function (J), wherein the cost function (J) is based on an integral of a norm of a difference between the measurement signal and the parametrized fundamental component via a time horizon (h), the time horizon (h) starting at an actual time point and going back via a predefined length, wherein the cost function (J) comprises a term based on a norm of the difference between a value of the fundamental component ($\hat{V}_{pcc}^1$) at the actual time point and a value of a previously estimated fundamental component ($\hat{V}_{pcc}^{1*}$) at the actual time point, wherein the previously estimated fundamental component has been determined for a previous time point.

15. The method of claim 4, wherein equations for the cost function matrix ($H(kT_s)$) and the cost function vector ($f(kT_s)$) have been determined offline by minimizing the cost function (J) analytically; and/or wherein the parameters ($\hat{x}(kT_s)$) are calculated from the equations by determining the cost function matrix ($H(kT_s)$) and the cost function vector ($f(kT_s)$) from the measurement signal; and/or wherein the parameters ($\hat{x}(kT_s)$) are calculated based on the inverse of the cost function matrix ($H(kT_s)$).

16. The method of claim 2, wherein the parameters ($\hat{x}(kT_s)$) are chosen, such that the cost function (J) is a quadratic function of the parameters and the cost function (J) has a term quadratic in the parameters defined by a cost function matrix ($H(kT_s)$) and a term linear in the parameters defined by a cost function vector ($f(kT_s)$).

17. The method of claim 2, wherein the cost function (J) is minimized online.

18. The method of claim 7, wherein the at least two measurement signals are Clarke transformed and the parameters are determined in a Clarke transformed reference frame.

19. The method of claim 2, further comprising:

calculating an actual amplitude and/or an actual phase shift of the fundamental component ($\hat{V}_{pcc}^1$) from the parameters.

20. The method of claim 3, further comprising:

calculating an actual phase angle of fundamental components ($\hat{V}_{pcc}^1$) of a multi-phase AC voltage from the parameters.

* * * * *